United States Patent [19]
Merchant et al.

[11] Patent Number: 6,090,687
[45] Date of Patent: Jul. 18, 2000

[54] SYSTEM AND METHOD FOR BONDING AND SEALING MICROFABRICATED WAFERS TO FORM A SINGLE STRUCTURE HAVING A VACUUM CHAMBER THEREIN

[75] Inventors: Paul P. Merchant, Belmont; Storrs Hoen, Brisbane, both of Calif.

[73] Assignee: Agilent Technolgies, Inc., Palo Alto, Calif.

[21] Appl. No.: 09/124,311

[22] Filed: Jul. 29, 1998

[51] Int. Cl.[7] ..................................... H01L 21/30
[52] U.S. Cl. .......................... 438/455; 438/456; 438/650
[58] Field of Search .................... 438/455, 456, 438/118, 106, 119, 127, 126, 650

[56] References Cited

U.S. PATENT DOCUMENTS

| | | | |
|---|---|---|---|
| 4,769,272 | 9/1988 | Byrne et al. | 428/209 |
| 5,262,347 | 11/1993 | Sands | 438/455 |
| 5,835,142 | 11/1998 | Nakamura et al. | 348/335 |

*Primary Examiner*—John F. Niebling
*Assistant Examiner*—Christopher Lattin

[57] ABSTRACT

A palladium contact and a gasket are formed on a first wafer. The gasket and contact are simultaneously engaged with a silicon layer of a second wafer. The wafers are then heated to a temperature that both forms a bond between the palladium contact of the first wafer with the silicon layer of the second wafer and that fuses the gasket to the second wafer. Therefore, when the temperature is decreased, the palladium-silicon bond maintains the alignment of the two wafers with respect to one another, and the gasket hardens to form seal around a periphery of the two wafers. By placing the two wafers in a vacuum environment prior to engaging the two wafers, the space encompassed by the gasket and the two wafers forms a sealed vacuum during the heating process. Therefore, the heating process not only forms a palladium-silicon bond between the two wafers, but it also forms a vacuum seal around selected components included within either of the two wafers.

17 Claims, 3 Drawing Sheets

SYSTEM AND METHOD FOR BONDING AND SEALING MICROFABRICATED WAFERS TO FORM A SINGLE STRUCTURE HAVING A VACUUM CHAMBER THEREIN

CROSS REFERENCE TO RELATED APPLICATIONS

This document is related to U.S. patent application entitled SYSTEM AND METHOD FOR FORMING ELECTROSTATICALLY ACTUATED DATA STORAGE MECHANISMS, assigned serial number (to be determined), (Atty. Docket 10972048-1), and filed by Merchant et al. on (to be determined), and to U.S. patent application entitled SYSTEM AND METHOD FOR BONDING WAFERS, assigned serial number (to be determined), (Atty. Docket 10961348-1), and filed by Merchant et al. on (to be determined), which are both incorporated herein by reference.

BACKGROUND OF THE INVENTION

1. Field of the Invention

The present invention generally relates to microfabrication and integrated circuit techniques and, in particular, to a system and method for bonding and sealing two wafers together into a single structure in order to create a vacuum chamber within the structure.

2. Related Art

In many situations, it may be desirable to form a vacuum chamber or an evacuated cavity within a microfabricated device. For example, it may be desirable to create a vacuum around complementary metal-oxide semiconductor (CMOS) components included within the device in order to increase the performance of the CMOS components.

In order to create the vacuum, a device having a chamber or cavity is initially constructed. The chamber is then evacuated and sealed so that the chamber remains evacuated. However, the process of evacuating and sealing the chamber can be difficult particularly when the device is microfabricated. As can be appreciated by one skilled in the art, the small scale of the microfabricated device makes it difficult to adequately create, evacuate and seal an opening to the chamber. In this regard, it is typically desirable to create and maintain a vacuum of at least $10^{-6}$ torr in many applications. Due to the difficulty of forming and sealing a vacuum within micromachined devices, most prior art microfabrication techniques of forming and sealing vacuum chambers are either cost prohibitive or inadequate for forming and maintaining vacuums at desirable levels.

Thus, a previously unaddressed need exists in the industry for providing a system and method for efficiently bonding and sealing wafers, particularly when the wafers are manufactured and/or processed using microfabrication techniques to form a single structure, while creating a vacuum chamber therein.

SUMMARY OF THE INVENTION

The present invention overcomes the inadequacies and deficiencies of the prior art as discussed above. Briefly described, the present invention provides a system and method for efficiently bonding and sealing two wafers to form a single structure while creating a vacuum chamber therein.

In accordance with the present invention, a first wafer having a palladium (Pd) contact is bonded to silicon (Si) included on a second wafer. A gasket is formed between the first and the second wafer. During the bonding process, portions of the gasket and one of the wafers engaged to the gasket fuse to each other. Therefore, when the wafers are cooled, the fused portion of the gasket hardens to form a hardened seal between the wafers.

In accordance with another feature of the present invention, the gasket is comprised of gold (Au), and a layer of germanium (Ge) is formed on one of the wafers. The gasket is configured to engage the layer of germanium, and during the bonding process, the germanium and the gold form an eutectic that fuses the gasket and one of the wafers together.

In accordance with another feature of the present invention, the temperatures associated with the bonding process are compatible with CMOS components. Therefore, either of the wafers can include CMOS components or other components sensitive to temperatures above approximately 500 degrees Celsius during the bonding process without damaging the components.

The present invention can also be viewed as providing a method for joining and sealing two micromachined wafers. Briefly described, the method can be broadly conceptualized by the following steps: providing a first wafer having palladium on a surface of the first wafer; providing a second wafer having silicon on a surface of the second wafer; providing a gasket on one of said wafers; engaging the gasket with the other one of the wafers; engaging the palladium with the silicon; engaging the gasket to the other one of the wafers; and increasing a temperature of the wafers in order to form a bond between the palladium and the silicon and in order to form a seal between the first wafer and the second wafer with the gasket.

The present invention has many advantages, a few of which are delineated below, as mere examples.

An advantage of the present invention is that a seal for two wafers can be formed during a bonding process used to bond the wafers together.

Another advantage of the present invention is that a chamber within a microfabricated device can be easily and reliably evacuated.

Another advantage of the present invention is that a CMOS-compatible vacuum bond can be realized. Therefore, additional steps to ensure the integrity of CMOS components are not necessary.

Other features and advantages of the present invention will become apparent to one skilled in the art upon examination of the following detailed description, when read in conjunction with the accompanying drawings. It is intended that all such features and advantages be included herein within the scope of the present invention, as is defined by the claims.

BRIEF DESCRIPTION OF THE DRAWINGS

The invention can be better understood with reference to the following drawings. The elements of the drawings are not necessarily to scale relative to each other, emphasis instead being placed upon clearly illustrating the invention. Furthermore, like reference numerals designate corresponding parts throughout the several views.

DETAILED DESCRIPTION OF THE INVENTION

Figure 1A:
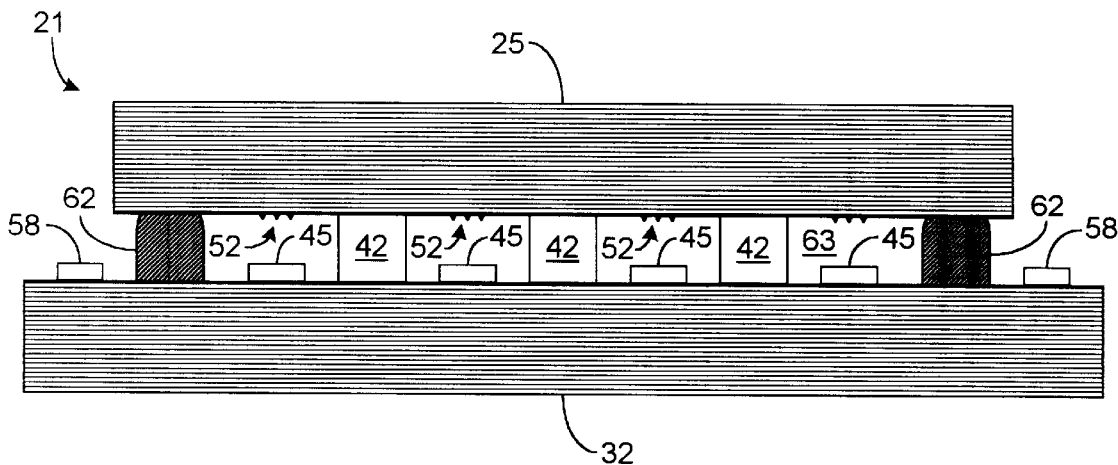
FIG. 1A is an cross sectional view of a structure bonded and sealed in accordance with the invention.
Figure 1B:
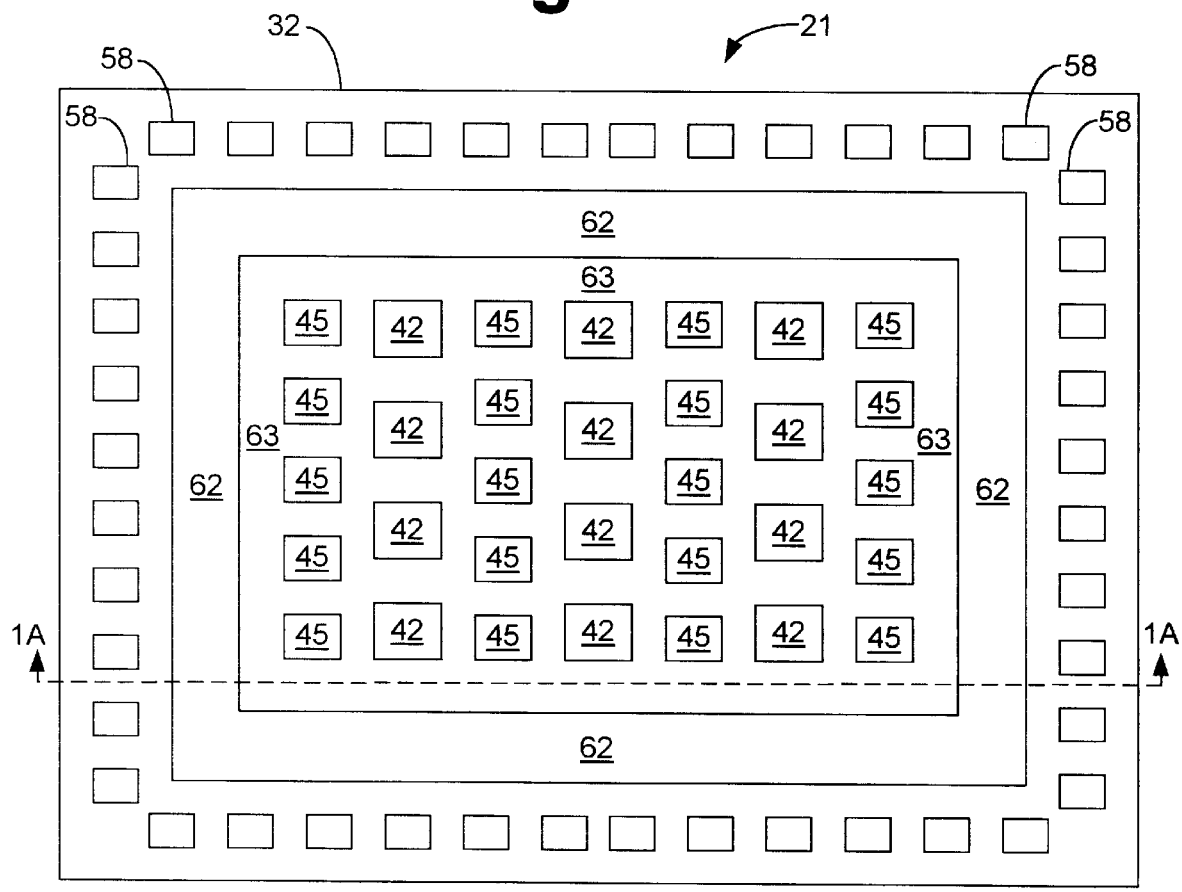
FIG. 1B is a top view of the structure depicted in FIG. 1A, with the top wafer removed for illustrative purposes.
Figure 1C:
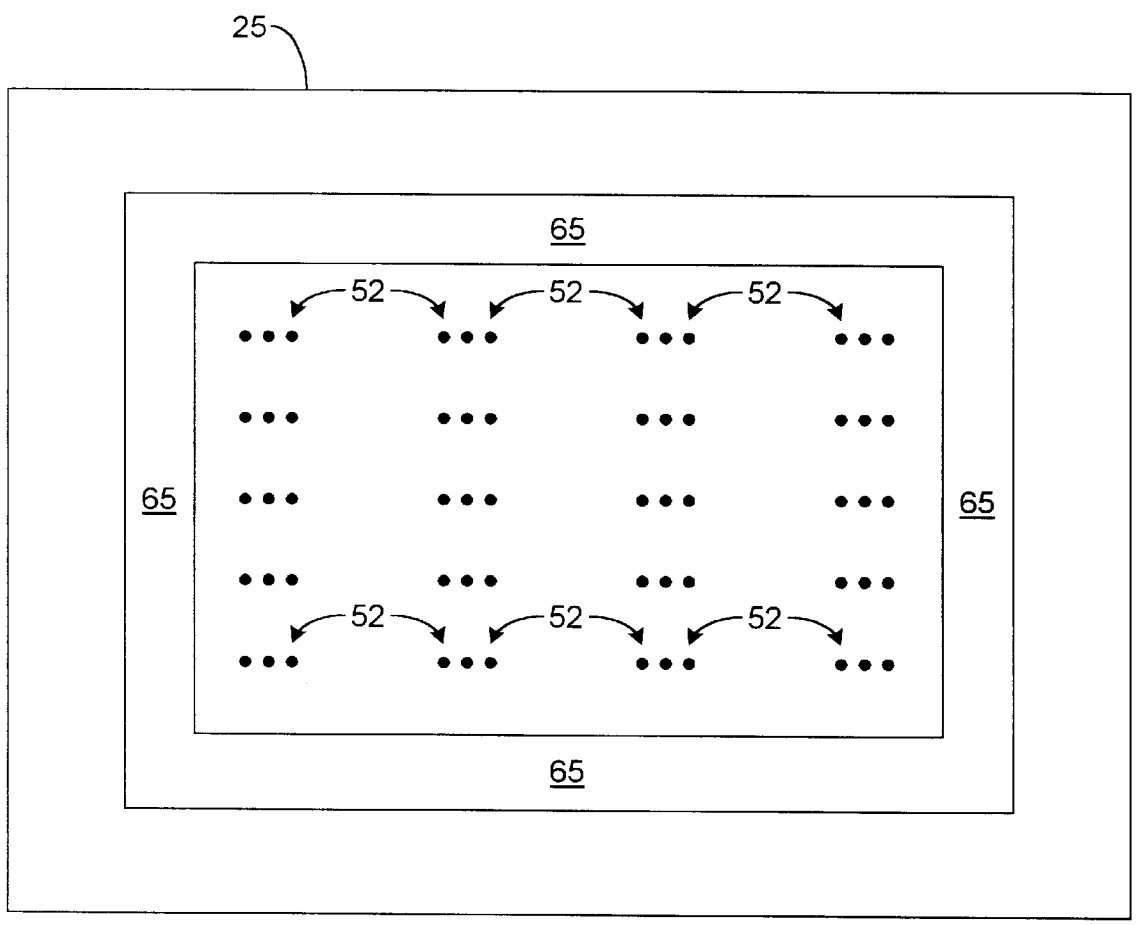
FIG. 1C is a bottom view of the structure depicted in FIG. 1A, with the bottom wafer, contacts, storage components and gasket removed for illustrative purposes.

F1A–1C depict a micromachined structure 21 manufactured in accordance with the invention. FIG. 1A depicts a cross-sectional view of the structure 21 having a top micromachined wafer 25 and a base micromachined wafer 32. Furthermore, FIG. 1B depicts a top view of the wafer 32, and FIG. 1C depicts a bottom view of the wafer 25.

Referring to FIG. 1A, the structure 21 is preferably designed to include contacts 42 in order to bond wafer 25 to wafer 32 and to maintain a position of wafer 25 with respect to wafer 32. In this regard, it may be desirable to precisely maintain the position of wafer 25 with respect to wafer 32 for a variety of reasons. For example, although not necessary for the implementation of the present invention, wafer 32 may have circuitry 45 disposed thereon, which includes CMOS or other types of components. The circuitry 45 may define a medium for electrically or magnetically storing information. As depicted by FIG. 1A, the top wafer 25 may include reading/writing elements 52 that read and write information to and from the media within circuitry 45. Therefore, the location of the reading/writing elements 52 with respect to the media within circuitry 45 should be located at a particular position with respect to the media of circuitry 45 within precise tolerances. Accordingly, it may be desirable for the wafer 25 via contacts 42 to precisely maintain a particular position with respect to wafer 32.

It should be noted that circuitry 45 and reading/writing elements 52 are not necessary for implementing the invention and are shown for illustrative purposes only. Furthermore, FIGS. 1A and 1B show electrical contacts 58, which are also not necessary for implementing the invention. Electrical contacts 58 are preferably designed to provide an outside interface to the circuitry 45 in the preferred embodiment. In this regard, electrical connections connect each contact 58 to particular circuitry 45 within structure 21, although the connections are not shown by FIGS. 1A and 1B for simplicity. Therefore, electrical signals can communicate between outside sources and the circuitry 45 within structure 21 via electrical contacts 58.

In the preferred embodiment, the structure 21 is configured to include at least one column or contact 42, preferably comprising palladium (Pd). The contacts 42 are preferably formed on wafer 32 through normal micromachining techniques. Once formed on wafer 32, the contacts 42 are then bonded to the top wafer 25 in order to connect wafer 32 to wafer 25. Preferably, top wafer 25 includes exposed silicon (Si), which can react with the palladium contact 42 during the bonding process to form a palladium-silicon bond between wafers 25 and 32. An example of a process of creating a palladium-silicon bond between two wafers is fully described in "System and Method for Bonding Wafers," filed by Merchant et al. on (to be determined) and assigned serial number (to be determined), which is incorporated herein by reference.

In this regard, the palladium contacts 42 are preferably attached to the base wafer 32 via an adhesion layer of chromium. The contacts 42 are configured to engage a silicon portion of wafer 25. When the temperature of the wafers 25 and 32 are annealed at certain temperatures (e.g., approximately 300 degrees Celsius for about 45 minutes, approximately 400 degrees Celsius for about 30 minutes or approximately 450 degrees Celsius for about 30 minutes), a palladium-silicon (Pd—Si) bond forms between the palladium contacts 42 and the silicon of the wafer 25.

Since the palladium contacts 42 may be bonded to silicon at temperatures less than approximately 450 degrees Celsius, the palladium-silicon bond between the two wafers can be formed without damaging any CMOS circuitry (or other components sensitive to temperatures above approximately 450 degrees Celsius) included within either of the two wafers 25 or 32. Therefore, the bonding process is compatible with CMOS circuitry, and wafers 25 and 32 may include CMOS components (or other components sensitive to temperatures above approximately 450 degrees Celsius) during the bonding process.

In addition to contacts 42, structure 21 is preferably designed to include a gasket 62 for sealing the structure 21. The gasket 62 is configured to engage both wafers 25 and 32 and to enclose a portion of the space between wafer 25 and 32, as depicted by FIGS. 1A and 1B. The space encompassed by gasket 62 and wafers 25 and 32 constitutes a chamber 63 within structure 21. Circuitry 45 preferably resides in this chamber 63 so that a vacuum, or other types of conditions, may be trapped and sealed around the circuitry 45, as will be discussed in more detail below.

The material of the gasket 62 preferably is a soft pliable material. Furthermore, although other embodiments are possible, gasket 62 is preferably designed to engage wafer 25 before contacts 42 engage wafer 25, when the two wafers 25 and 32 are joined together. Therefore, in joining the two wafers 25 and 32, the gasket 62 is designed to engage the wafer 25 and to deform, due to a pressure that is exerted between the two wafers 25 and 32. Heating the joined wafers 25 and 32 forms the bond between contacts 42 and wafer 25, as discussed above, and fuses the gasket 62 to wafer 25. When the structure 21 is cooled, the fused material hardens to form a seal around a perimeter of the chamber 63. In this regard, the gasket 62 constitutes a side wall of the chamber 63. Therefore, the heating of the structure 21 not only forms the bond between the contacts 45 and the wafer 25, but it also seals the chamber 63.

To help create a sufficient seal, a germanium layer 65 is preferably formed on wafer 25 as depicted by FIG. 1C. The germanium layer 65 is configured to engage the gasket 62 when wafer 25 is engaged with wafer 32. The germanium layer 65 is configured to fuse with the gasket 62 during the bonding process and, therefore, to help form a sufficient seal for the structure 21. For the purposes of the invention, a sufficient seal is a seal capable of maintaining vacuum conditions within chamber 63.

In the preferred embodiment, the material of the gasket 62 is preferably gold (Au). Therefore, when the gasket 62 is engaged with wafer 25 and heated, the surfaces of gasket 62 and wafer 25 engaged together form an eutectic which has a melting point close to or lower than the bonding temperature. If the germanium layer 65 is formed on wafer 25, then a gold-germanium (AuGe) eutectic is formed at the interface of the gasket 62 and layer 65. Otherwise, a gold-silicon (AuSi) eutectic is formed since the surface of wafer 25 is preferably silicon. When the eutectic cools and solidifies, a leak proof seal is formed between the wafers 25 and 32 by the hardened eutectic and gasket 62.

In many situations, it is desirable for the chamber 63 sealed by gasket 62 to be evacuated. In such a situation, the structure 21 should be placed in a vacuum chamber (not shown) while bonding of the two wafers 25 and 32 is performed. By engaging and heating the wafers 23 and 32, as discussed above, while the structure 21 is situated within an evacuated vacuum chamber, a vacuum is trapped and sealed within chamber 63. Therefore, in the preferred embodiment, the chamber 63 defined by the wafers 32 and 35 and the gasket 62 is designed to be evacuated.

OPERATION

The preferred use and operation of the present invention is described below with reference to FIGS. 1A–1C and FIGS. 2A–2B.

Figure 2A:
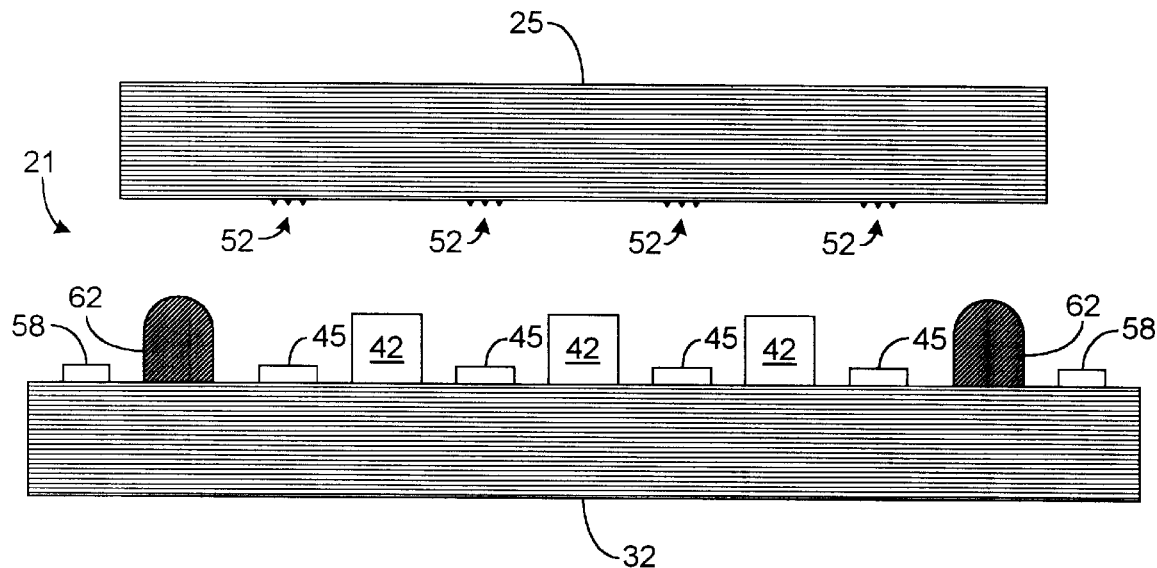
FIG. 2A is an illustration of the structure depicted in FIG. 1A, before the two wafers of the structure are engaged.
Figure 2B:
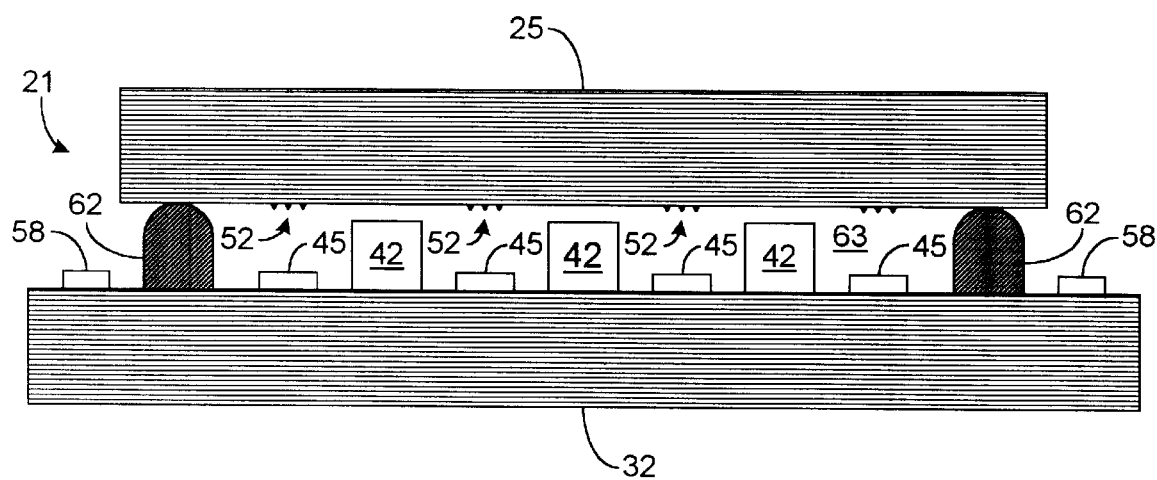
FIG. 2B is an illustration of the structure depicted in FIG. 1A, once the top wafer initially engages the gasket formed on the bottom wafer.

Initially, referring to FIG. 2A, wafers 25 and 32 are manufactured through microfabrication techniques known in the art. In the preferred embodiment, wafer 25 preferably includes silicon on portions of its bottom surface, and the bottom surface of wafer 25 also includes a germanium layer 65, as depicted by FIG. 1C. Furthermore, contacts 42, preferably comprised of palladium, and a gasket 62, preferably comprised of gold, are formed on wafer 32 according to FIGS. 1B and 2A. Although not necessary for the implementation of the present invention, it may be desirable to form circuitry 45, reading/writing elements 52 and/or electrical connections 58 on wafer 32. It should be noted that contacts 42 may be located on either side or on both sides of the perimeter defined by gasket 62.

The wafers 25 and 32 are preferably placed into an annealing chamber which is then evacuated. Wafer 25 is then engaged with the gasket 62. As can be seen by reference to FIG. 2B, gasket 62 is taller than contacts 42 such that wafer 25 engages gasket 62 prior to engaging any of the contacts 42. However, any configuration that allows a seal to form via gasket 62 when the structure 21 is heated during the bonding process is sufficient to implement the invention.

After engaging wafer 25 with gasket 62, the wafers 25 and 32 are pressed against one another. The structure 21 is then heated to a bonding temperature by increasing the temperature of the annealing chamber to the bonding temperature, as will be discussed in further detail. This bonding temperature is preferably below at least approximately 500 degrees Celsius so that any CMOS circuitry or other types of components included by either wafer 25 or 32 are not damaged. When heated, the surfaces of gasket 62 and wafer 25 (i.e., germanium layer 65 in the preferred embodiment) engaged together form an eutectic.

After maintaining the bonding temperature for a prescribed time, as will be discussed further below, the palladium contacts 42 bond with the silicon in wafer 25 to form a palladium-silicon bond between wafers 25 and 32 and the eutectic melts. The temperature of the annealing chamber is then reduced in order to complete the bonding process of the palladium-silicon bond.

During the cooling process, the melted eutectic hardens or solidifies to form a seal between the gasket 62 and the wafer 25. Since the annealing chamber is evacuated, the formation of the seal creates a sealed vacuum in the chamber 63. Therefore, once the manufacturing process is complete, the structure 21 can be removed from the annealing chamber while preserving a vacuum sealed within the chamber 63.

During the bonding process of the preferred embodiment, the temperature of the structure 21 is initially increased to approximately 200 degrees Celsius within about 30 seconds. Although not necessary, it is preferable to change the temperature linearly (i.e., "ramp" the temperature) when the temperature of the structure 21 is being varied during the bonding process.

The temperature of structure 21 is preferably held at approximately 200 degrees Celsius for about 30 seconds and then increased to the bonding temperature in about 15 seconds. Experiments have shown that bonding temperatures and durations sufficient for the invention are approximately 450 degrees Celsius for about 30 minutes, approximately 400 degrees Celsius for about 30 minutes, or approximately 300 degrees Celsius for about 45 minutes. It should be noted that other bonding temperatures and durations are possible for forming a sufficient bond between the palladium contacts 42 and wafer 23 and for fusing gold gasket 62 to wafer 25.

After maintaining the bonding temperature for its associated duration, the temperature of the structure 21 is decreased below approximately 100 degrees Celsius in about six minutes. At this point, a bond between contacts 42 and wafer 25 should be sufficient enough to keep wafer 21 attached and aligned to wafer 23 during normal operation within precise tolerances. Furthermore, the chamber 63 should be sealed by the wafers 32 and 35 and the gasket 62.

It should be noted that the material of contacts 42, wafer 23 and gasket 62 are not necessarily pure palladium, pure silicon and pure gold, respectively. Although the preferred embodiment utilizes pure elements of palladium, silicon and gold, one ordinarily skilled in the art should realize that other elements can be added or combined with the silicon of wafer 25, the palladium contacts 42 and/or the gold gasket 62. However, the melting temperature of the sealing material should be close to the bonding temperature in order to achieve the benefit of forming a seal and a bond during the same heating process.

Furthermore, it should be noted that utilizing the materials and the heating process described by the preferred embodiment enables the wafers 25 and 32 to be bonded and sealed with temperatures below approximately 450 degrees Celsius. Therefore, utilizing the materials and the heating process of the preferred embodiment enables structure 21 to be formed without damaging any CMOS circuitry or other types of temperature sensitive components included within wafers 25 and 32. Consequently, additional steps to preserve CMOS components or other types of temperature sensitive components are not necessary. However, one skilled in the art should realize that other materials may be used to implement the invention, but the temperatures necessary to sufficiently bond the wafers 25 and 32 and/or to form the seal with gasket 62 may be affected.

It should be further noted that the gasket 62 does not necessarily have to be formed on wafer 32 and engage wafer 25. For example, it should be apparent to one skilled in the art that gasket 62 may be formed on wafer 25 and engage wafer 32. Any configuration of gasket 62 is sufficient as long as a seal between wafer 25 and 32 is formed during the heating process.

In concluding the detailed description, it should be noted that it will be obvious to those skilled in the art that many other variations and modifications may be made to the preferred embodiment. All such variations and modifications are intended to be included herein within the scope of the present invention, as set forth in the following claims.

Now, therefore, the following is claimed:

1. A method, comprising steps of:

providing a first wafer having palladium on a surface of said first wafer;

providing a second wafer having silicon on a surface of said second wafer;

providing a gasket on one of said wafers;

engaging said gasket with the other one of said wafers;

engaging said palladium with said silicon; and increasing a temperature of said wafers in order to form a bond between said palladium and said silicon and in order to form a seal between said first wafer and said second wafer.

2. The method of claim 1, further including a step of forming an eutectic between said gasket and said one of said wafers during said increasing step.

3. The method of claim 1, further including steps of:

increasing said temperature to a particular temperature;

forming said bond at said particular temperature; and forming said seal at said particular temperature.

4. The method of claim 3, further including a step of creating a vacuum around said first and second wafers prior to said engaging said palladium step and said increasing step.

5. The method of claim 3, further including a step of engaging gold elements within said gasket to said other one of said wafers.

6. The method of claim 4, further including a step of deforming said gasket during said engaging said gasket step.

7. The method of claim 4, further including a step of maintaining an alignment of said second wafer with respect to said first wafer via said bond.

8. The method of claim 5, further comprising steps of:

providing a germanium layer on said other one of said wafers prior to said engaging said gasket step; and engaging said germanium layer with said gasket.

9. The method of claim 7, further including a step of maintaining said vacuum around selected components of one of said wafers with said seal.

10. A method for evacuating a chamber within a structure, comprising steps of:

providing a first wafer including a contact on said first wafer;

engaging said contact with a second wafer;

engaging a gasket with one of said wafers;

forming a vacuum around said first and second wafers;

annealing said wafers subsequent to said forming a vacuum step in order to form a bond between said contact and said second wafer; and melting eutectic material between said gasket and said one of said wafers during said annealing step.

11. The method of claim 10, further including a step of deforming said gasket.

12. The method of claim 10, further including steps of:

maintaining an alignment of said wafers via said bond; and maintaining said vacuum within said structure via said seal.

13. The method of claim 10, wherein said eutectic includes gold.

14. The method of claim 13, wherein said eutectic includes germanium.

15. The method of claim 10, further including a step of bonding palladium to silicon to form said bond.

16. The method of claim 15, further including a step of fusing gold elements within said gasket to said one of said wafers.

17. The method of claim 16, further including a step of engaging material including germanium with said gasket during said engaging a gasket step.

* * * * *